(12) United States Patent
Obikane et al.

(10) Patent No.: US 6,441,630 B1
(45) Date of Patent: Aug. 27, 2002

(54) PROBING APPARATUS AND HEAD PLATE OPENING/CLOSING FORCE-REDUCING MECHANISM

(75) Inventors: Tadashi Obikane; Masashi Shimizu, both of Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/634,884

(22) Filed: Aug. 7, 2000

(30) Foreign Application Priority Data

Aug. 9, 1999 (JP) .......................................... 11-225722

(51) Int. Cl.[7] ............................. G01R 31/02; F16F 5/00
(52) U.S. Cl. ..................... 324/758; 324/755; 267/64.11
(58) Field of Search ................................ 324/758, 755, 324/754, 761, 765; 414/172, 173; 267/64.11

(56) References Cited

U.S. PATENT DOCUMENTS 5,729,149 A * 3/1998 Bradshaw et al. .......... 324/758
5,886,488 A * 3/1999 Nakajima et al. ........... 318/432
6,114,869 A * 9/2000 Williams et al. ............ 324/765

FOREIGN PATENT DOCUMENTS

JP 10-125744 5/1998

* cited by examiner

*Primary Examiner*—N. Le
*Assistant Examiner*—Anjan K. Deb
(74) *Attorney, Agent, or Firm*—Oblon, Spivak, McClelland, Maier & Neustadt, P.C.

(57) ABSTRACT

A head plate opening/closing force-reducing mechanism includes a head plate (13) one end of which is rotatably attached (13B) to a main body so as to open/close an opening (31) formed in the main body (10), and at least one push-up mechanism (16, 17, 18) attached to at least one edge (36) of the head plate, the push-up mechanism being located in a position close to an opposite end of the head plate.

20 Claims, 4 Drawing Sheets

PROBING APPARATUS AND HEAD PLATE OPENING/CLOSING FORCE-REDUCING MECHANISM

CROSS-REFERENCE TO RELATED APPLICATIONS

This application is based upon and claims the benefit of priority from the prior Japanese Patent Application No. 11-225722, Aug. 9, 1999; the entire contents of which are incorporated herein by reference.

BACKGROUND OF THE INVENTION

The present invention relates to a head plate opening/closing force-reducing mechanism, a probing apparatus, and an opening/closing force-reducing mechanism for opening/closing a heavy object. More specifically, the present invention relates to a mechanism for reducing the force of opening/closing a heavy head plate, a probing apparatus capable of suppressing the inclination of a probe card due to deformation of a head plate, and a mechanism for reducing the force of opening/closing a heavy object.

As illustrated in FIGS. 4 and 5, a probing apparatus for an integrated circuit formed on a wafer W generally comprises a loading chamber 1 and a probing chamber 2. The loading chamber 1 transports and pre-alignments the wafer W. The probing chamber 2 receives the wafer W from the loading chamber 1 and inspects electrical characteristics of the integrated circuit on the wafer W. The loading chamber 1 includes tweezers 3 and a sub-chuck 4. While the wafer W is being transported by the tweezers 3, it is pre-aligned by the sub-chuck 4 with reference to its orientation flat and notch. The probing chamber 2 includes a main chuck 5 and an alignment mechanism 6. The main chuck 5 on which the wafer W is mounted, moves in X, Y and θ directions and aligns the wafer w with probes 7A of a probe card 7 above the main chuck 5 in association with the alignment mechanism 6. The main chuck 5 rises in the Z direction and brings the wafer W into electrical contact with the probes 7A to inspect the electrical characteristics of the integrated circuit formed on the wafer w through the probes 7A and test head T.

The probing chamber 2 is opened in order to exchange the probe card 7, perform maintenance of the probing chamber 2, and the like. The probe card 7 is thus detachably mounted on the head plate 8 and the test head T is rotatably mounted thereon. To open the probing chamber 2, the test head T rotates and retreats from the position of the head plate 8 of the probing chamber 2, and the head plate 8 rotates. The head plate 8 is, as shown in FIG. 6, hinge-coupled to one end of the probe chamber 2 (referred to as a rear end hereinafter) through a shaft 8A. The head plate 8 rotates around the shaft 8A to open/close the probing chamber 2.

BRIEF SUMMARY OF THE INVENTION

FIG. 6 shows an example of a head plate opening/closing force-reducing mechanism for reducing the force required for opening/closing a head plate. The head plate opening/closing force-reducing mechanism includes a gas spring 9 attached to the rear end portion of a main body (which is relatively close to a position in which the head plate 8 is rotatably mounted on the main body). The gas spring 9 pushes up a rod by its push-up force. The pushed-up rod rotates the head plate 8 to smoothly open/close the upper opening of the main body. In the prior art probing apparatus, however, the load of the test head T is applied to the probe card 7 and so is the reaction force of probing pressure exerted in the inspection. The load and force deform the head plate 8 and, in this case, the head plate 8 is not deformed uniformly and thus the probe card 7 inclines. As a result, the prior art probing apparatus has the problem that the probes 7A cannot be brought into stable contact with an electrode pads of an object to be inspected.

It has been recently contrived to screw the head plate 8 on right and left receiving seats (not shown) provided in front of the probing chamber 2 when the probing apparatus operates. Since the gas spring 9 pushes up the rear end portion of the head plate 8 screwed by the receiving seats, a very great push-up force is required to reduce the force for opening/closing the head plate 8. It is when the head plate 8 is closed that the push-up force of the gas spring 9 is the greatest. The great push-up force caused when the head plate 8 is closed, deforms the head plate 8 more and more complicated.

An object of the present invention is to resolve each or some of the problems of the prior art described above.

Another object of the present invention is to provide a head plate opening/closing force-reducing mechanism capable of smoothly opening/closing a head plate.

Still another object of the present invention is to provide a probing apparatus in which the inclination of a probe card can greatly be suppressed by deforming a head plate uniformly.

Yet another object of the present invention is to provide a probing apparatus capable of performing a stable inspection with high reliability.

The other objects and advantages of the present invention are described below and some of them will be made obvious from the disclosure or obtained by practicing the present invention. The objects and advantages of the present invention are achieved in combination with the means specifically described herein.

A head plate opening/closing force-reducing mechanism according to a first aspect of the present invention, comprises:

a head plate one end of which is rotatably attached to a main body so as to open/close an opening formed in the main body; and at least one push-up mechanism attached to at least one edge of the head plate, the push-up mechanism being located in a position close to an opposite end of the one end of the head plate.

Preferably, the head plate opening/closing force-reducing mechanism further comprises a plurality of push-up mechanisms, each of the push-up mechanisms comprising a rod section and an extending-force providing section which hold the rod section such that the rod section extends and contracts and which provide an extending-force to the rod section, wherein the plurality of push-up mechanisms are coupled in series to each other, and rod sections of push-up mechanisms other than a push-up mechanism which is nearest to the head plate lift and lower along a lifting/lowering guide mechanism.

A probing apparatus according to a second aspect of the present invention comprises:

a main body having an opening;

a head plate one end of which is rotatably attached to the main body so as to open/close the opening, the head plate rotating around the one end of the head plate;

a probe card detachably mounted on the head plate, and a plurality of receiving seats for the head plate, the plurality of receiving seats being fixed to corresponding portions on a circumference of the opening, distances between each of the receiving seats and a center of the probe card being same, and the head plate being fastened on the receiving seats.

Preferably, in the probing apparatus, the receiving seats are fixed to the corresponding portions near to four corners of the circumference of the opening.

Preferably, in the probing apparatus, the receiving seats each have a level adjusting mechanism for mounting the head plate horizontally.

A probing apparatus according to a third aspect of the present invention comprises:

a main body having an opening;

a head plate one end of which is rotatably attached to the main body so as to open/close the opening;

a probe card detachably mounted on the head plate, a plurality of receiving seats for the head plate, the plurality of receiving seats being fixed to corresponding portions on a circumference of the opening, and the head plate being fastened on the receiving seats; and a head plate opening/closing force-reducing mechanism including at least one push-up mechanism attached to at least one edge of the head plate, the push-up mechanism being located in a position close to an opposite end of the one end of the head plate.

Preferably, in the probing apparatus, the head plate opening/closing force-reducing mechanism further includes a plurality of push-up mechanisms, each of the push-up mechanisms comprising a rod section and an extending-force providing section which hold the rod section such that the rod section extends and contracts and which provide an extending-force to the rod section, wherein the plurality of push-up mechanisms are coupled in series to each other, and rod sections of push-up mechanisms other than a push-up mechanism which is nearest to the head plate lift and lower along a lifting/lowering guide mechanism.

Preferably, in the probing apparatus, the plurality of receiving seats are fixed to the corresponding portions near to four corners of the opening, distances between the receiving seats and a center of the probe card are same, and the head plate is fastened on the receiving seats.

Preferably, in the probing apparatus, the head plate opening/closing force-reducing mechanism further includes a plurality of push-up mechanisms each holding a rod section such that the rod section extends and contracts and having an extending-force providing section for providing the rod section with an extending force, wherein the plurality of push-up mechanisms are coupled in series to each other, and rod sections of push-up mechanisms other than a push-up mechanism which is nearest to the head plate lift and lower along a lifting/lowering guide mechanism.

An opening/closing force-reducing mechanism for rotating a heavy object and opening/closing the heavy object, according to a fourth aspect of the present invention, comprises:

a first push-up mechanism including:
  a first rod section having a top end rotatably attached to the heavy object, and
  a first extending-force providing section for holding the first rod section such that the rod section extends and contracts and providing the first rod section with an extending force;

a second push-up mechanism including:
  a second rod section having a top end coupled to the first extending-force providing section of the first push-up mechanism, and a second extending-force providing section for holding the second rod section such that the rod section extends and contracts and providing the second rod section with an extending force; and a first lifting/lowering guide mechanism for guiding the top end of the second rod section when the second rod section is extended by the second extending-force providing section.

Preferably, the opening/closing force-reducing mechanism further comprises a third push-up mechanism, the third push-up mechanism including:
  a third rod section having a top end coupled to the second extending-force providing section of the second push-up mechanism;
  a third extending-force providing section for holding the third rod section such that the rod section extends and contracts and providing the third rod section with an extending force; and
  a second lifting/lowering guide mechanism for guiding the top end of the third rod section when the third rod section is extended by the third extending-force providing section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention is not limited to a probing apparatus for inspecting electrical characteristics of an integrated circuit formed on a wafer, nor is it limited to a head plate opening/closing force-reducing mechanism applied only to the probing apparatus. The present invention relates to a probing apparatus for inspecting electrical characteristics of commonly-used electronic circuit components including an LCD, and a head plate opening/closing force-reducing mechanism which is applied to the probing apparatus. The present invention also relates to an opening/closing force-reducing mechanism for rotating a heavy object such as a head plate. In order to explain the present invention more specifically, however, the probing apparatus for inspecting electrical characteristics of an integrated circuit formed on a wafer will now be described herein.

Figure 1:
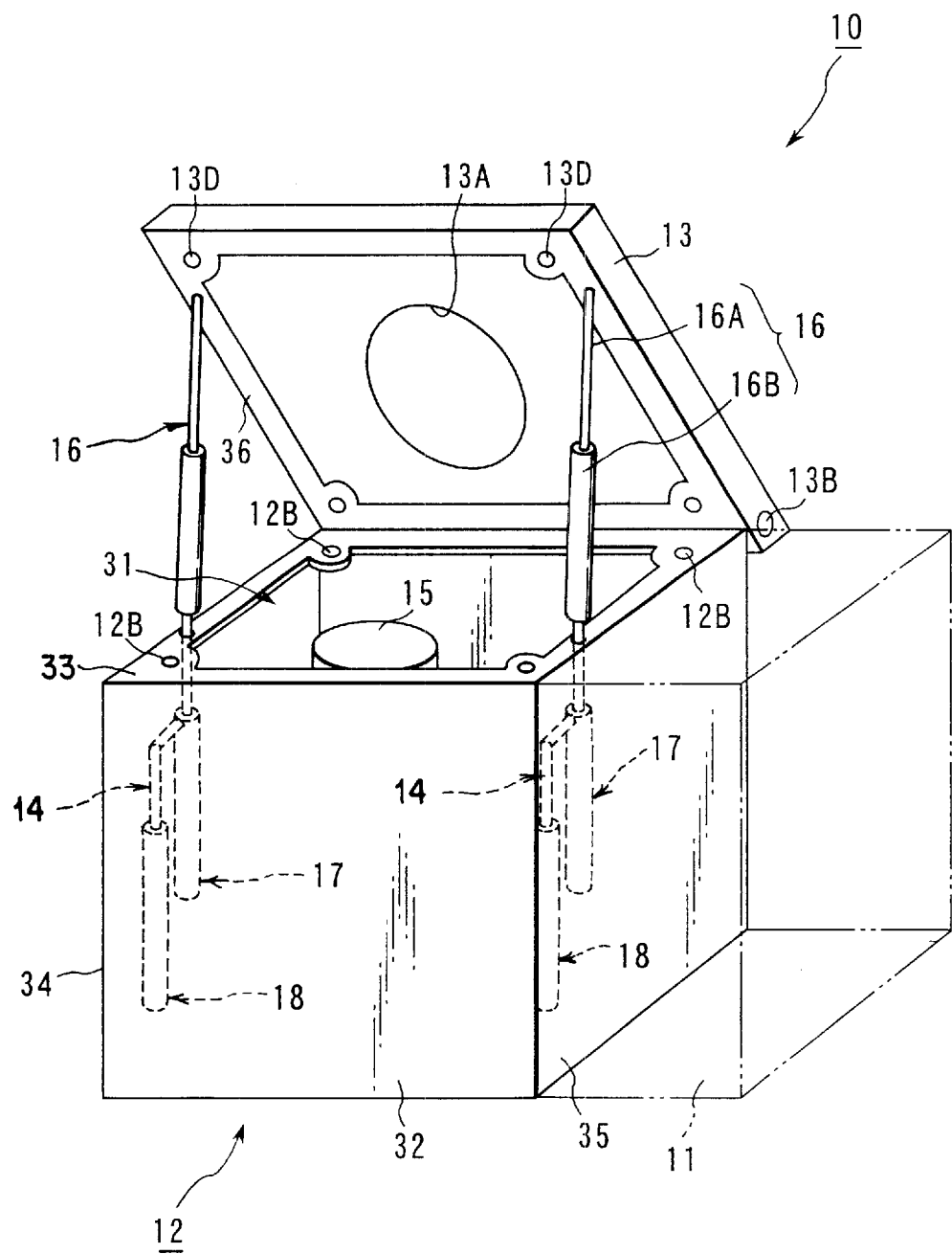
FIG. 1 is a schematic perspective view showing a probing apparatus to which a head plate opening/closing force-reducing mechanism according to an embodiment of the present invention is applied (showing a head plate which is open)
Figure 2A:
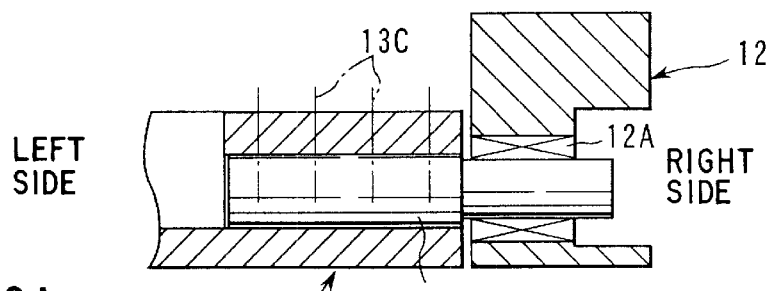
FIG. 2A is a cross-sectional view showing a hinge-coupling portion of the head plate for coupling the head plate onto the side wall of a probing chamber.

The probing apparatus 10 according to an embodiment of the present invention will now be described with reference to FIGS. 1 to 3. As FIG. 1 illustrates, the probing apparatus 10 comprises a loading chamber 11 (indicated by a chain double-dashed line) for transporting a wafer, a probing chamber 12, which is provided adjacent to the loading chamber 11, for inspecting electrical characteristics of the wafer, and a head plate 13 for opening/closing a top-end opening 31 of the probing chamber 12. The loading chamber 11 and probing chamber 12 can be formed integrally as one component or separated from each other. A central hole 13A is formed in substantially the central part of the head plate 13. A probe card 7 (shown in FIG. 4) is detachably inserted into the central hole 13A. The head plate 13 is rotatably attached to a rear end portion of the probing apparatus, for which various structures can be adopted. As one example, FIG. 2A shows a structure employing a shaft 13B. An intermediate portion of the shaft 13B is coupled and fixed to the end portion of the head plate 13 by means of screws 13C. The right and left end portions of the shaft 13B are rotatably supported by bearings 12A in their corresponding right and left positions of the rear end portion of the opening 31 of the probing chamber 12. One end of the shaft 13B is coupled to the rear end portion of the probing chamber 12, and the intermediate portion of the shaft 13B can rotatably be attached to the end portion of the head plate 13.

In FIG. 1, reference numeral 15 denotes a main chuck. Receiving seats 12B are arranged on the edge 33 of a front wall 32 of the opening 31 of the probing chamber 12. It is preferable, as shown in FIG. 1, that the receiving seats 12B be arranged at four corners of the edge 33. It is also preferable that the rear receiving seats 12B be arranged slightly in front of the shaft 13B. Preferably the head plate 13 is fastened on these receiving seats 12B. Preferably the receiving seats 12B have the same shape and are arranged at substantially the same distance from the center of the central hole 13A or the center of the probe card. The four receiving seats 12B uniformly receive the load of a test head and the reaction force of probing pressure exerted in the inspection, so that the head plate 13 is bent symmetrically to prevent the probe card from inclining.

Figure 2B:
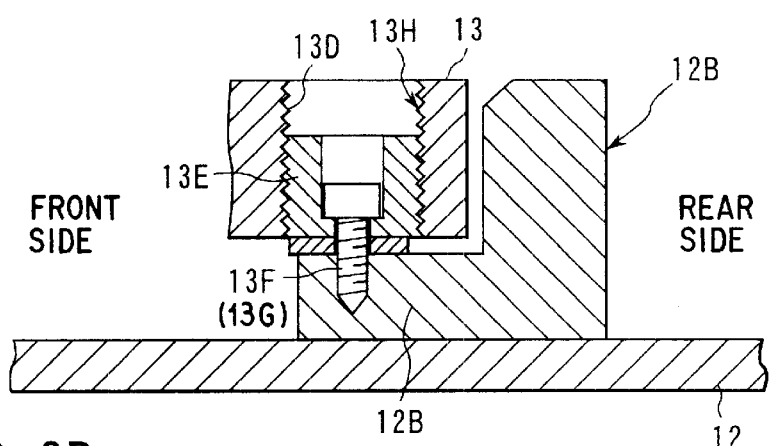
FIG. 2B is a cross-sectional view showing a fastening structure of the head plate and receiving seats for coupling the head plate onto the side wall of the probing chamber.
Figure 6:
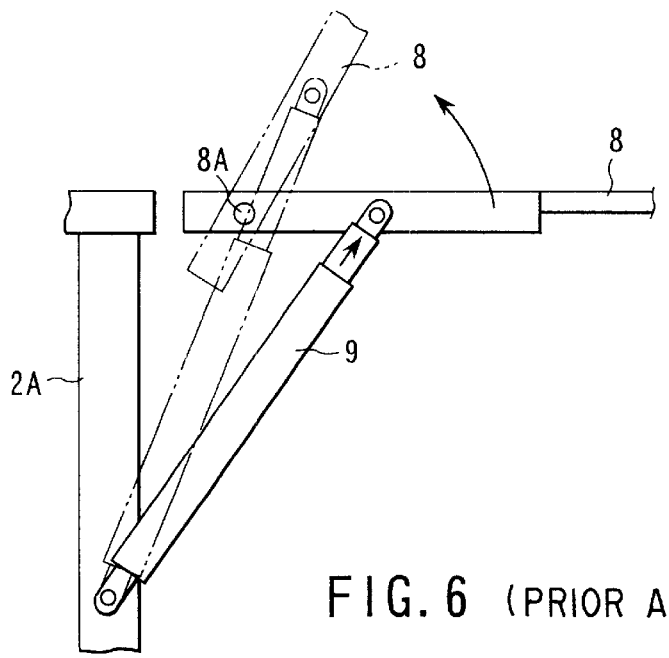
FIG. 6 is an enlarged side view of the major part of a head plate opening/closing force-reducing mechanism of the prior art probing apparatus shown in FIG. 4.

As FIG. 2B illustrates, through holes 13D are formed in the head plate 13 in correspondence with internal threads 13G of the receiving seats 12B. Each of the through holes 13D has an internal thread 13H on the inner surface thereof. A level adjusting screw 13E is fitted to the internal thread 13H of each of the through holes 13D to adjust the horizontal surface of the head plate 13. It is preferable that the head plate 13 be fixed onto the receiving seats 12B by means of set screws 13F.

The head plate 13 is too heavy to be opened/closed by hand. Preferably, a pair of head plate opening/closing force-reducing mechanisms 14 is provided in order to reduce the force generated when the head plate 13 is opened/closed.

The head plate opening/closing force-reducing mechanisms 14 are provided along the left and right walls 34 and 35 of the probing chamber 12. The mechanisms 14 allow the head plate 13 to be opened/closed by a slight force. When the head plate 13 is closed, the mechanisms 14 are set in the state shown in FIG. 3A. When the plate 13 is opened, they are set in the state shown in FIG. 3B.

Figures 3A, 3B:
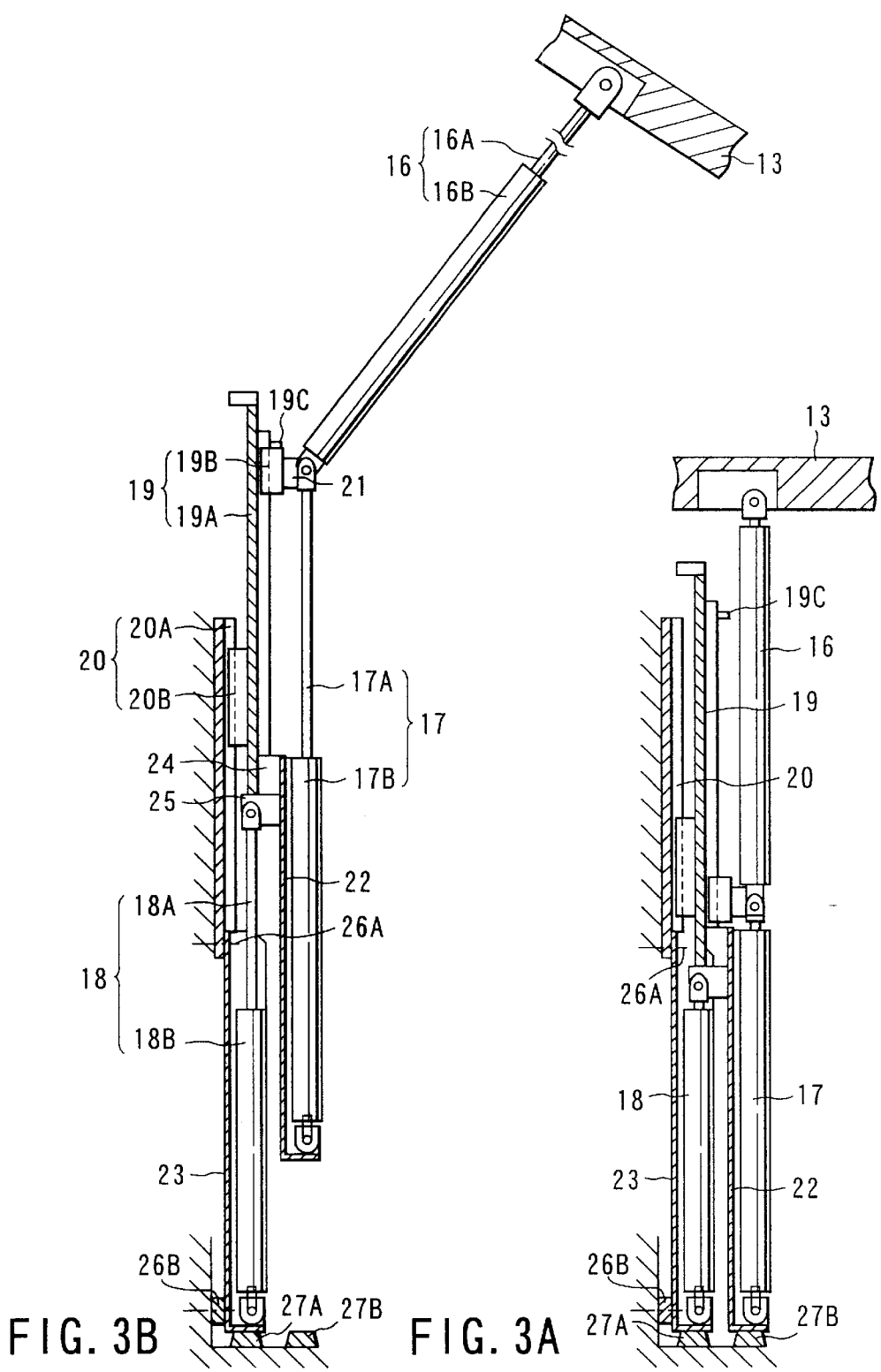
FIG. 3A is a side view showing the head plate opening/closing force-reducing mechanism when the head plate is closed in the probing apparatus shown in FIG. 1.
FIG. 3B is a side view showing the head plate opening/closing force-reducing mechanism when the head plate is open in the probing apparatus shown in FIG. 1.
Figure 4:
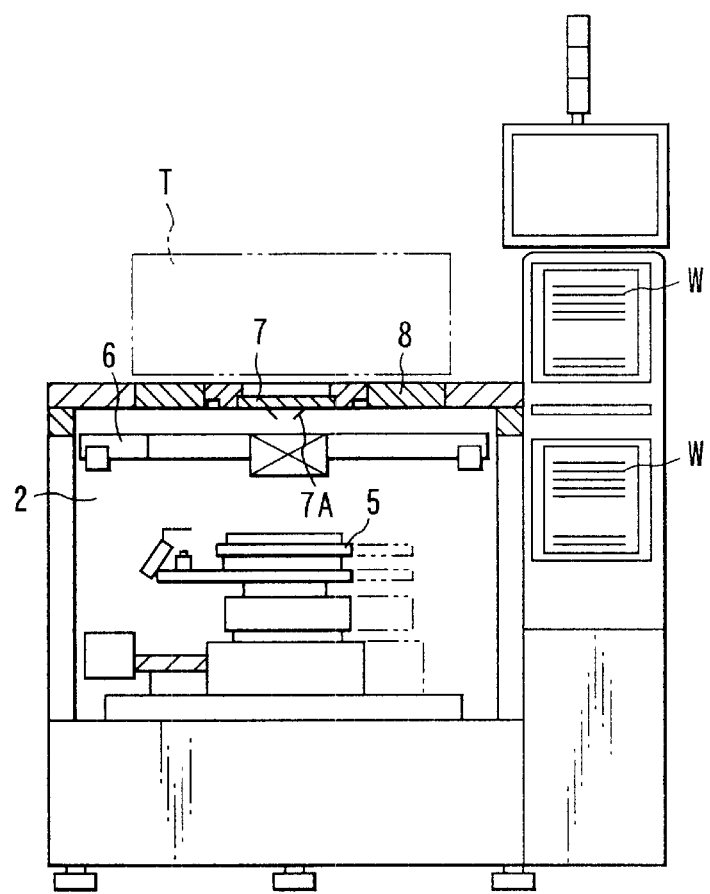
FIG. 4 is a cutaway front view showing a probing chamber of a prior art probing apparatus.
Figure 5:
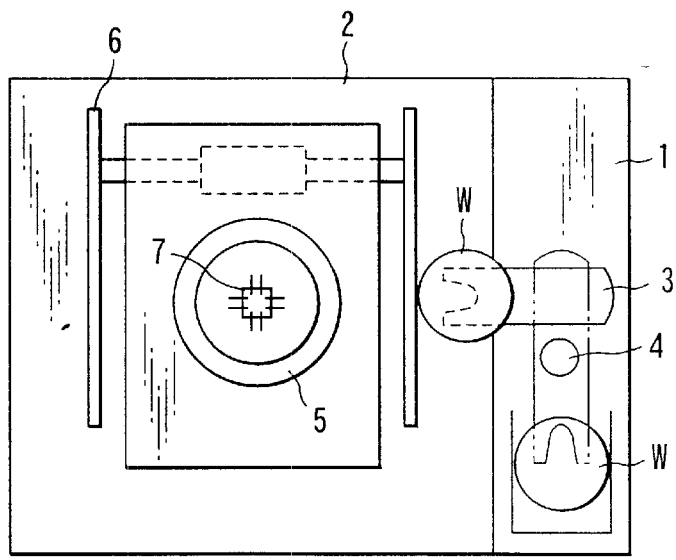
FIG. 5 is a plan view of the interior of the prior art probing apparatus shown in FIG. 4.

A specific example of the head plate opening/closing force-reducing mechanisms 14 is shown in FIGS. 1, 3A and 3B. This example includes first to third push-up mechanisms 16 to 18 coupled in series to each other as a push-up means of the head plate 13. These push-up mechanisms may be each considered to be a gas spring. A head plate opening/closing force-reducing mechanism adopting the gas springs will be described below. The tops of the first gas springs 16 are connected to the right and left front edges of the head plate 13. As will be described later, the first gas springs 16 are lifted and lowered by the second gas springs 17, respectively, and the second gas springs 17 are lifted and lowered along the first guide rails by the third gas springs 18, respectively. The bottoms of the third gas springs 18 are fixed in the probing chamber 12. These push-up mechanisms 16, 17 and 18 include rods 16A, 17A and 18A and extending-force providing sections for generating an extending force to push up the rods 16A, 17A and 18A. Since the push-up mechanisms are gas springs, the extending-force providing sections correspond to cylinders. Hereinafter the extending-force providing sections will be referred to as cylinders.

As shown in FIGS. 3A and 3B, the head plate opening/closing force-reducing mechanism 14 include first and second lifting/lowering guide mechanisms 19 and 20 each constituted of an LM guide. The rods 17A and 18A of the second and third gas springs 17 and 18 lift and lower in a given direction (e.g., vertical direction) by means of the first and second lifting/lowering guide mechanisms 19 and 20, respectively. The first and second lifting/lowering guide mechanisms 19 and 20 include first and second guide rails 19A and 20A and first and second fitting members 19B and 20B which are fitted to the guide rails 19A and 20A, respectively. A stopper 19C is fixed to the top end portion of the first guide rail 19A. The stopper 19C limits the end of the first fitting member 19B which is lifting. The second fitting member 20B is fixed onto the back of the first guide rail 19A. The first lifting/lowering guide mechanism 19 lifts and lowers along the second guide rail 20A. The second guide rail 20A is fixed on the inner surface of the probing chamber 12 or the outer surfaces 34 and 35 thereof.

As illustrated in FIGS. 3A and 3B, the top of the rod 16A of the first gas spring 16 is mounted on the head plate 13. It is preferable that the top of the rod 16A be rotatably mounted on the head plate 13. Pin connection can thus be adopted as the mounting means. The proximal end of a cylinder 16B is rotatably attached to a bracket 21 fixed to the first fitting member 19B by pin connection. The top of the rod 17A of the second gas spring 17 is attached to the bracket 21 by pin connection. The rod 17A lifts and lowers to the stopper 19C along the first guide rail 19A through the fitting member 19B. A coupling portion of the first gas spring 16 and the head plate 13 is located close to the front through hole 13D (which is opposed to the shaft 13B). In other words, the coupling portion is located slightly behind the through hole 13D.

When the opening 31 of the probing chamber 12 is closed, the push-up force of the head plate opening/closing force-reducing mechanism 14 is almost absorbed at fixed points of the receiving seats 12B of the head plate 13 to prevent the head plate 13 from being deformed.

Preferably, cylinders 17B and 18B of the second and third gas springs 17 and 18 are held in long holding brackets 22 and 23 whose sections are each shaped like a square bracket. The bottom ends of the cylinders 17B and 18B are connected to their respective holding brackets 22 and 23, and the cylinder 17B and the holding bracket 22 are formed integrally as one component, as are the cylinder 18B and the holding bracket 23. The bottom ends of the cylinders and the holding brackets can be connected by any fixing means, preferably by pin connection. The second and third gas springs 17 and 18 cause their rods 17A and 18A to be extended from the holding brackets 22 and 23, respectively. The first guide rail 19A is coupled to the top of the holding bracket 22 of the second gas spring 17 through a coupling member 24. It is preferable that a bracket 25 be fixed on the back of the holding bracket 22 and formed on the bottom of the coupling member 24. The top of the rod 18A of the gas spring 18 is attached to the bracket 25 by pin connection. The rod 18A of the third gas spring 18 lifts and lowers along the second guide rail 20A by means of the holding bracket 22 and the first lifting/lowering guide mechanism 19. The rod 18A allows the first and second gas springs 16 and 17 to lift and lower.

The third gas spring 18 is arranged vertically under the second lifting/lowering guide mechanism 20. The holding bracket 23 is fixed to the probing chamber 12 by screws 26A and 26B. Preferably the holding bracket 23 is mounted on an elastic base 27A formed of rubber or the like. Preferably an elastic base 27B for receiving the holding bracket 22 of the second gas spring 17 is provided adjacent to the elastic base 27A. As FIG. 3A shows, when the top-end opening 31 of the probing chamber 12 is closed with the head plate 13, the second and third gas springs 17 and 18 are arranged in parallel, and the first gas spring 16 is located on an extension of the second gas spring 17.

An operation of the probing apparatus 10 will now be described. When the probing apparatus 10 is in use, the top-end opening 31 of the probing chamber 12 is closed with the head plate 13. The test head electrically contacts the top surface of the probe card. The load of the head plate 13 is applied to the probe card, as is the reaction force generated when probes are pressed on objects to be inspected. The load acts on the head plate 13 complicatedly from above and below through the probe card. Since the head plate 13 is fastened on the receiving seats 12B having the same shape and arranged at an equal distance from the center of the probe card, the head plate 13 is not almost subjected to an unbalanced load but deformed symmetrically, and the probe card is not likely to incline. For this reason, all probes uniformly contact a wafer during the inspection, and the inspection can be improved in stability and reliability.

When the exchange of the probe card or the maintenance of the probing apparatus 10 is performed after the inspection, the head plate 13 is changed from its closing state shown in FIG. 3A to its opening state shown in FIG. 3B. To do this, the test head on the head plate 13 rotates and retreats therefrom. The set screws 13F are removed from their corresponding receiving seats 12B arranged at four corners of the head plate 13. The head plate opening/closing force-reducing mechanism 14 supports an operator who is lifting the front edge of the head plate 13. The rods 16A to 18A of the first to third gas springs 16 to 18 extend and push up the head plate 13. Though the head plate 13 is relatively heavy, it can be rotated around the shaft 13B by a slight force.

More specifically, the rod 18A of the third gas spring 18 extends and pushes up the second gas spring 17 and the first lifting/lowering guide mechanism 19 along the second guide rail 20A. The rod 17A of the second gas spring 17 extends along the first guide rail 19A and pushes up the first gas spring 16. As the first gas spring 16 rotates relative to a pin coupling portion between the springs 16 and 17, the head plate 13 inclines gradually and opens. When the head plate 13 is opened, it inclines the most as shown in FIG. 1. In this state, the head plate 13 is maintained in a fixed position by the head plate opening/closing force-reducing mechanism 14. Thereafter, the exchange of the probe card or the maintenance of the interior of the probing apparatus is performed. After these operations are completed, the opening 31 is closed with the head plate 13 and, in this case, the head plate 13 rotates slowly by means of the head plate opening/closing force-reducing mechanism 14.

When the probing chamber 12 is closed with the head plate 13, the right and left front edges of the head plate 13 receive the greatest force from the mechanism 14. Since, however, the first gas spring 16 is provided close to the receiving seat 12B, the push-up load of the mechanism 14 is almost canceled out by the reaction force at the receiving seat 12B, with the result that the head plate 13 is hardly deformed and the probe card is hardly inclined. Consequently, all probes contact a wafer uniformly during the inspection, and the inspection can be improved in stability and reliability.

According to the above embodiment described above, since the head plate opening/closing force-reducing mechanism 14 is coupled to the front edge of the head plate 13, the force for pushing up the head plate 13 can greatly be decreased. Furthermore, the deformation of the head plate 13 and the inclination of the probe card is suppressed, and the probe contacts the wafer uniformly, with the result that the inspection can be improved in stability and reliability.

Since the first to third push-up mechanisms coupled in series to each other are adopted as the head plate opening/closing force-reducing mechanism 14, the above-described advantages can be obtained more effectively.

The gas springs 16 to 18 are used as the head plate opening/closing force-reducing mechanism 14, and the top end of the rod 16A of the first gas spring 16 is connected to the front edge of the head plate 13. The above advantages can thus be obtained more effectively.

Since the push-up mechanisms are provided at the front edge of the head plate 13, especially close to the receiving seats 12B, the deformation of the head plate can be suppressed further and the reliability of the inspection can be improved further.

According to the present embodiment, since the rods 17A and 18A of the second and third gas springs 17 and 18 other than the first gas spring 16 which is nearest to the head plate 13, are lifted and lowered by the first and second lifting/lowering guide mechanisms 19 and 20, the head plate opening/closing force-reducing mechanism 14 can stably be operated.

According to the present embodiment, the receiving seats 12B for supporting the head plate 13 are arranged at four corners of the opening of the probing chamber 12 and formed in the same shape, and the distances between the receiving seats 12B and the center of the probe card are substantially the same. Therefore, the load of the test head and the reaction force of probing pressure exerted in the inspection are uniformly received by the four receiving seats 12B, the head plate 13 is deformed symmetrically, and the probe card is prevented from inclining. The reliability of inspection can thus be improved further.

In the foregoing embodiment, the gas springs are explained as a push-up mechanism; however, a cylinder mechanism such as an air cylinder and a hydraulic cylinder, and a cylinder including a spring can be adopted. Moreover, three gas springs are coupled in series to each other; however, the number of gas springs can be two or four or more. In short, any design changes can be made without departing from the scope of the subject matter of the present invention.

According to the invention recited in each of claims, the head plate is opened and closed smoothly and thus deformed uniformly, and the probe card is greatly prevented from inclining. Therefore, the inspection can stably be performed with high reliability.

The head plate opening/closing force-reducing mechanism according to the present invention allows a heavy object, such as a head plate, to be rotated smoothly by a slight force.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A head plate opening/closing mechanism comprising:
   a main body having an opening;
   a head plate one end of which is rotatably attached to the main body so as to open and close the opening of the main body; and
   at least one set of push-up mechanisms including at least two push-up mechanisms coupled in series to each other;
   wherein one end of the at least one set of push-up mechanisms is attached to the head plate, and one of the two push-up mechanisms pushes up another push-up mechanism.

2. The head plate opening/closing mechanism according to claim 1, wherein one end of one of the at least one set of push-up mechanisms is attached to the main body.

3. The head plate opening/closing mechanism according to claim 1, wherein the at least one set of push-up mechanisms includes a push-up mechanism one end of which is attached to the main body and another push-up mechanism which is coupled in series to the push-up mechanism and one end of which is attached to the head plate.

4. The head plate opening/closing mechanism according to claim 1, wherein the at least one set of push-up mechanisms includes at least one push-up mechanism having a push-up direction guide.

5. The head plate opening/closing mechanism according to clam 1, wherein the push-up mechanism attached to the main body pushes up a push-up mechanism having a push-up direction guide along the push-up direction guide.

6. The head plate opening/closing mechanism according to clam 1, wherein the at least one set of push-up mechanisms comprises a first push-up mechanism attached to the main body, a second push-up mechanism having a push-up direction guide, and a third push-up mechanism one end of which is attached to the head plate.

7. The head plate opening/closing mechanism according to clam 1, wherein the at least one set of push-up mechanisms comprises a first push-up mechanism attached to the main body, a second push-up mechanism coupled in series to the first push-up mechanism and having a push-up direction guide, and a third push-up mechanism which is coupled in series to the second push-up mechanism and one end of which is attached to the head plate.

8. The head plate opening/closing mechanism according to claim 1, wherein the opening of the main body includes a plurality of receiving seats which receive the head plate, the receiving seats being arranged around the opening.

9. The head plate opening/closing mechanism according to claim 8, wherein each of the receiving seats includes a level adjusting mechanism.

10. The head plate opening/closing mechanism according to claim 1, wherein said at least one set of push-up mechanisms includes two pairs of push-up mechanisms.

11. The head plate opening/closing mechanism according to clam 1, wherein said at least one set of push-up mechanisms includes at least one push-up mechanism comprising a gas spring.

12. A probing apparatus comprising:
    a main body having an opening;
    a head plate having an attached portion rotatably attached to the main body; and
    at least one set of a plurality of push-up mechanisms configured to open and close the head plate to cover the opening of the main body, the plurality of push-up mechanisms coupled in series such that a lower one of the plurality of push-up mechanisms lifts and lowers an upper one of the plurality of push-up mechanisms sequentially.

13. The probing apparatus according to claim 12, wherein the plurality of push-up mechanisms includes at least one push-up mechanism having a push-up direction guide.

14. The probing apparatus according to clam 13, wherein the plurality of push-up mechanisms include a push-up mechanism attached to the main body and configured to lift and lower a push-up mechanism having a push-up direction guide along the push-up direction guide.

15. The probing apparatus according to clam 12, wherein the plurality of push-up mechanisms comprises a first push-up mechanism attached to the main body, a second push-up mechanism having a push-up direction guide, and a third push-up mechanism attached to the head plate.

16. The probing apparatus according to clam 12, wherein the plurality of push-up mechanisms comprises a first push-up mechanism attached to the main body, a second push-up mechanism coupled in series to the first push-up mechanism and having a push-up direction guide, and a third push-up mechanism positioned between the second pushup mechanism and the head plate.

17. The probing apparatus according to claim 12, wherein the main body includes a plurality of receiving seats each configured to receive the head plate.

18. The probing apparatus according to claim 17, wherein the plurality of receiving seats each includes a level adjusting mechanism.

19. The probing apparatus according to claim 12, wherein said at least one set of push-up mechanisms comprises two sets of the plurality of push-up mechanisms.

20. The probing apparatus according to clam 12, wherein the plurality of push-up mechanisms comprises at least one push-up mechanism comprising a gas spring.

* * * * *